(12) United States Patent
Wang

(10) Patent No.: US 8,273,180 B2
(45) Date of Patent: Sep. 25, 2012

(54) DEVICE FOR FILM COATING

(75) Inventor: Chung-Pei Wang, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 754 days.

(21) Appl. No.: 12/431,778

(22) Filed: Apr. 29, 2009

(65) Prior Publication Data

US 2009/0320757 A1 Dec. 31, 2009

(51) Int. Cl.
*C23C 16/00* (2006.01)

(52) U.S. Cl. ........................ 118/727; 118/726

(58) Field of Classification Search ............... 118/727, 118/726

See application file for complete search history.

(56) References Cited

U.S. PATENT DOCUMENTS

| | | | | |
|---|---|---|---|---|
| 4,328,763 A * | 5/1982 | Sommerkamp et al. | ...... | 118/727 |
| 5,227,203 A | 7/1993 | Kibe et al. | | |
| 6,340,501 B1 * | 1/2002 | Kamiyama et al. | ...... | 427/255.6 |
| 2001/0011524 A1 * | 8/2001 | Witzman et al. | ...... | 118/718 |
| 2003/0073375 A1 * | 4/2003 | Lee | ...... | 446/153 |
| 2005/0005857 A1 * | 1/2005 | Kido et al. | ...... | 118/726 |
| 2007/0221131 A1 * | 9/2007 | Yoshikawa et al. | ...... | 118/726 |
| 2009/0098280 A1 * | 4/2009 | Tahon | ...... | 427/69 |

FOREIGN PATENT DOCUMENTS

| CN | 1600894 A | 3/2005 |
|---|---|---|
| JP | 9-165674 A | 6/1997 |

* cited by examiner

*Primary Examiner* — Keath Chen
(74) *Attorney, Agent, or Firm* — Altis Law Group, Inc.

(57) ABSTRACT

An exemplary device for film coating, is provided. The device has an evaporating unit, wherein the evaporating unit includes a driving member and a carrier. The driving member has an extending rotatable shaft. The carrier includes a main body, a plurality of branches and a plurality of crucibles. The branches each extend from the main body. The crucibles each are supported by a respective one of the branches and configured for receiving a film material therein. The rotatable shaft is engaged in the main body and thereby rotating the carrier.

10 Claims, 9 Drawing Sheets

DEVICE FOR FILM COATING

BACKGROUND

1. Technical Field

The present invention relates to film coating technology, and particularly, to a device for film coating.

2. Description of Related Art

Film coating technology has been widely used in optical art, for example, coating various films such as IR-cut film and anti-reflection film on surfaces of lenses.

A typical device for film coating includes a process chamber, an evaporating unit and a substrate supporting unit. The evaporating unit and the substrate supporting unit are arranged inside the process chamber, and the evaporating unit is positioned opposite to the substrate supporting unit. The substrate supporting unit is configured for supporting one or more substrates (product or semi-product) such as lenses to be coated. The evaporating unit is configured for evaporating film materials onto the substrates.

The evaporating unit usually includes only one crucible configured for receiving a film material during a film coating process. However, in such condition, when two or more films are to be coated on the substrate, the coating process must be stopped to replace the film material or change the entire crucible, thus an efficiency is lowered. In addition, if a large quantity of a film material is filled in the crucible, melting the film material will take a long time.

What is needed, therefore, is a device for film coating, which can overcome the above shortcomings.

BRIEF DESCRIPTION OF THE DRAWINGS

Many aspects of the device for film coating can be better understood with reference to the following drawings. The components in the drawings are not necessarily drawn to scale, the emphasis instead being placed upon clearly illustrating the principles of the present device. Moreover, in the drawings, like reference numerals designate corresponding parts throughout the several views.

DETAILED DESCRIPTION OF THE EMBODIMENTS

Embodiments of the present device for film coating will now be described in detail below and with reference to the drawings.

Figure 1:
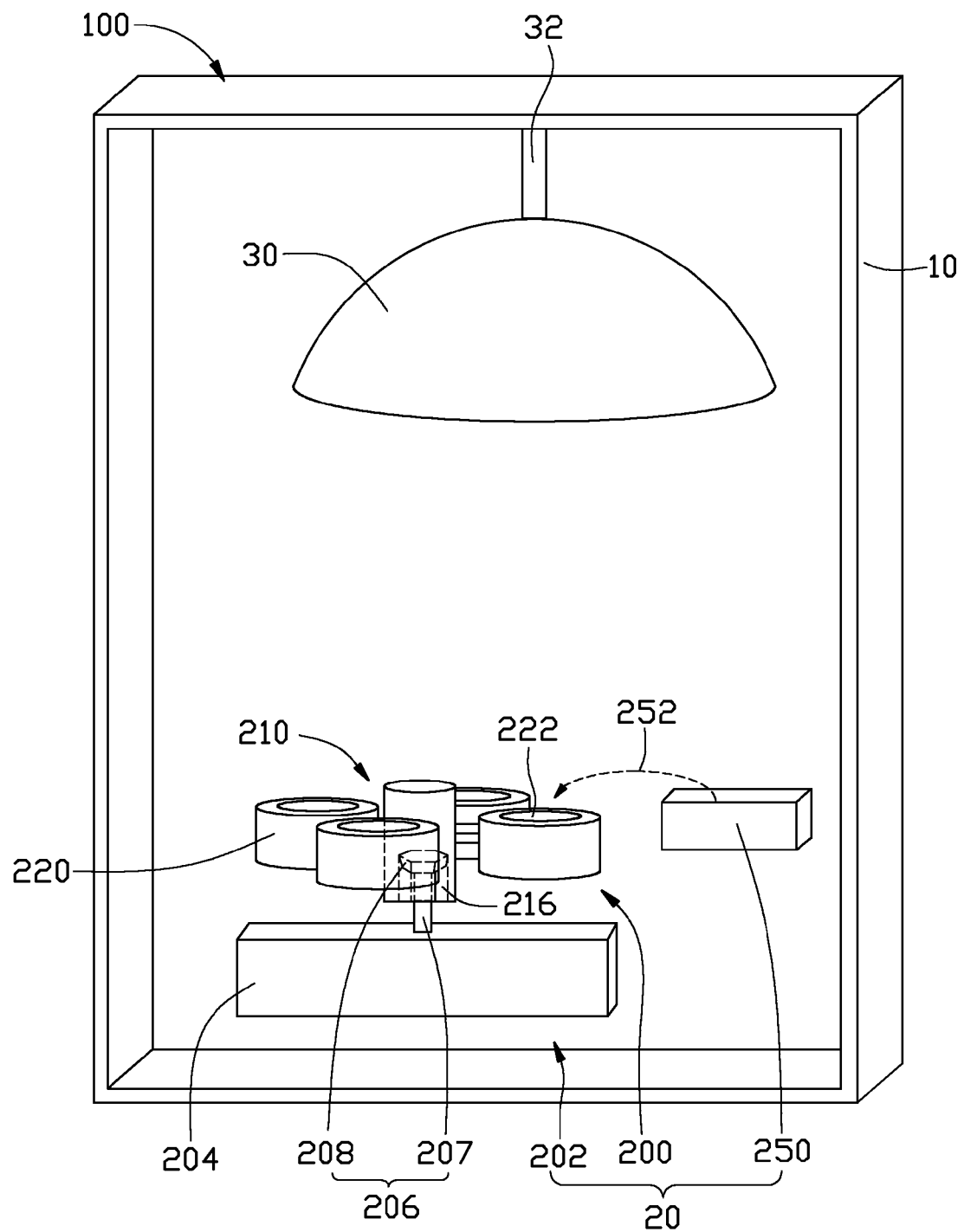
FIG. 1 is a schematic view of a device for film coating in accordance with a first embodiment, the device including a supporter and a plurality of crucibles.
Figure 2:
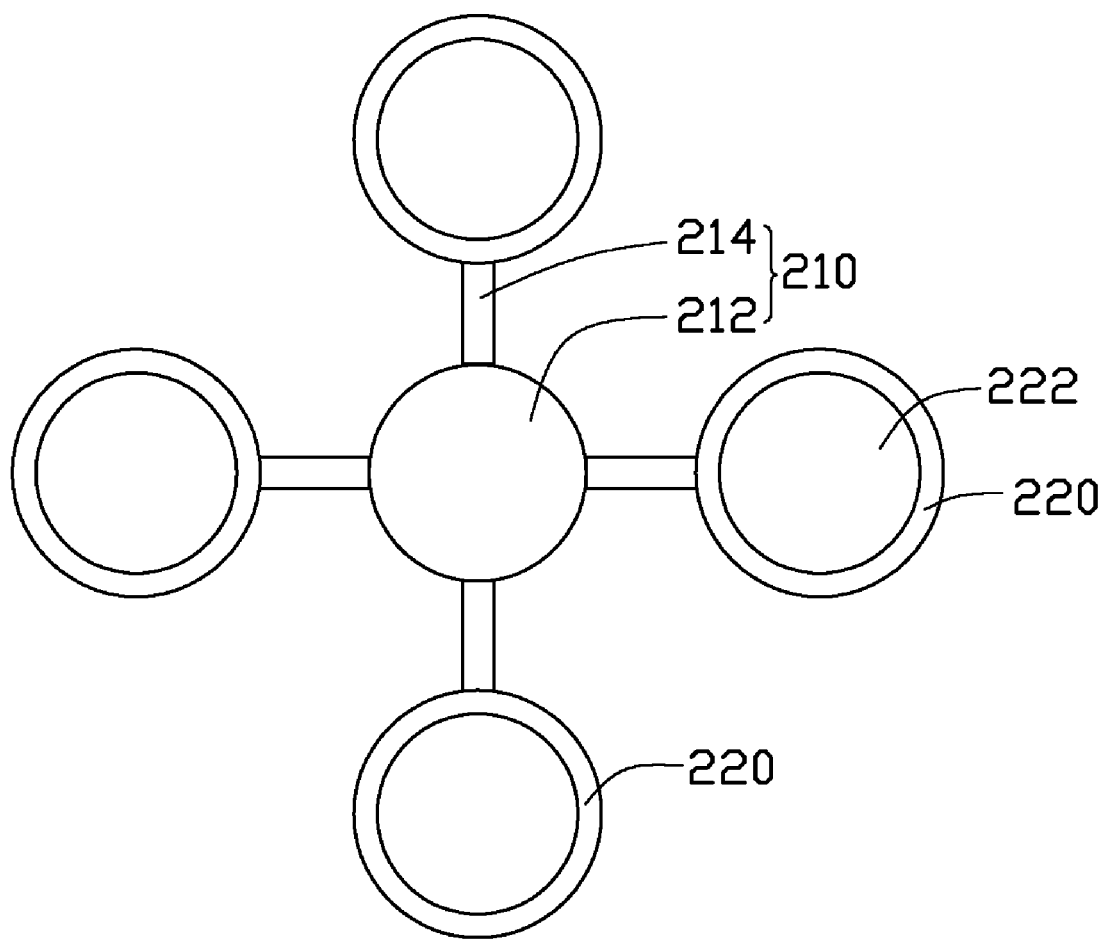
FIG. 2 is a plan view of the supporter and the crucibles shown in FIG. 1.

Referring to FIGS. 1 and 2, an exemplary device 100 for film coating in accordance with a first embodiment, is provided. The device 100 includes a process chamber 10, an evaporating unit 20 and a substrate supporting unit 30. The process chamber 10 is a vacuum process chamber. The evaporating unit 20 and the substrate supporting unit 30 are arranged inside the process chamber 10. The substrate supporting unit 30 is attached to an inner wall of the process chamber 10 via a suspender 32. The substrate supporting unit 30 is configured for supporting one or more substrates such as lenses (not shown) to be coated.

The evaporating unit 20 is opposite to the substrate supporting unit 30. The evaporating unit 20 includes an electron emitter 250, a driving member 202, and a carrier 200. The driving member 202 includes a stator 204 and an extending rotatable shaft 206 which is driven by the stator 204. The rotatable shaft 206 has a cylindrical body 207 and a polygonal-shaped end 208.

The carrier 200 includes a supporter 210 and a plurality of crucibles 220 supported by the supporter 210. The supporter 210 includes a cylindrical main body 212 and a plurality of branches 214. The main body 212 has a polygonal-shaped recess 216 defined at one end thereof. The polygonal-shaped end 208 is engaged in the polygonal-shaped recess 216, for facilitating rotating of the main body 212. The branches 214 extend from a peripheral side surface of the main body 212. The branches 214 are arranged in an imaginary ring, and are equally spaced apart from each other.

The crucibles 220 are attached to ends of the branches 214. The crucibles 220 each have a receiving space 222. The receiving spaces 222 can receive different film materials or receive a same film material. Electron beam 252 emitted by the electron emitter 250 can reach the nearest receiving space 222 of the crucible 220 facing to the substrate to be coated, thereby melting the corresponding film material in the receiving space 222, and thus making the film material ready for evaporating and depositing on the substrate. Due to the rotatable shaft 206, the entire carrier 200 can be rotated, thus the crucibles 220 can in turn face to substrate. In this way, a sequential film coating process can be carried out.

Figure 3:
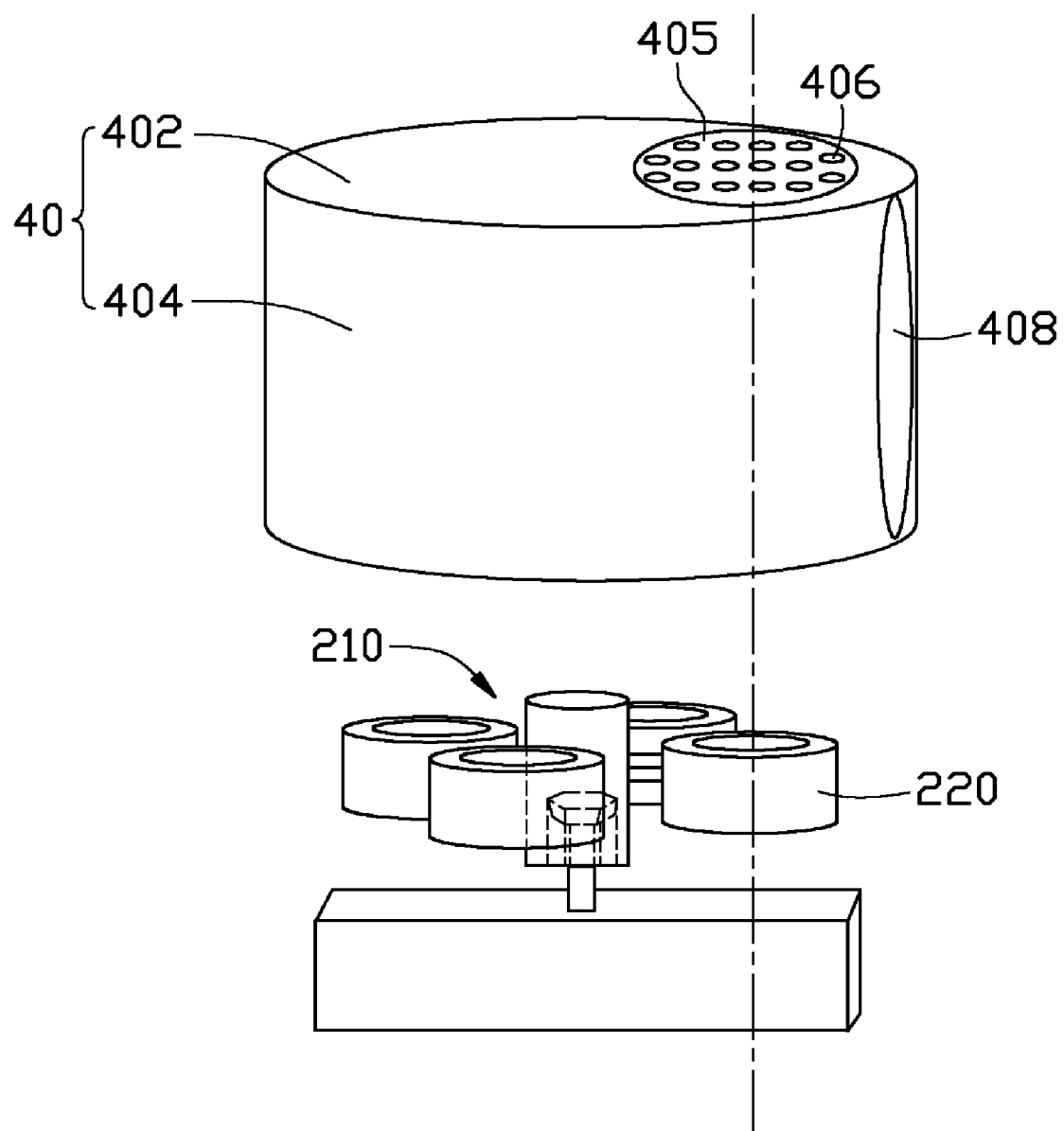
FIG. 3 is a cover provided for partially covering the crucibles shown in FIG. 1.
Figure 4:
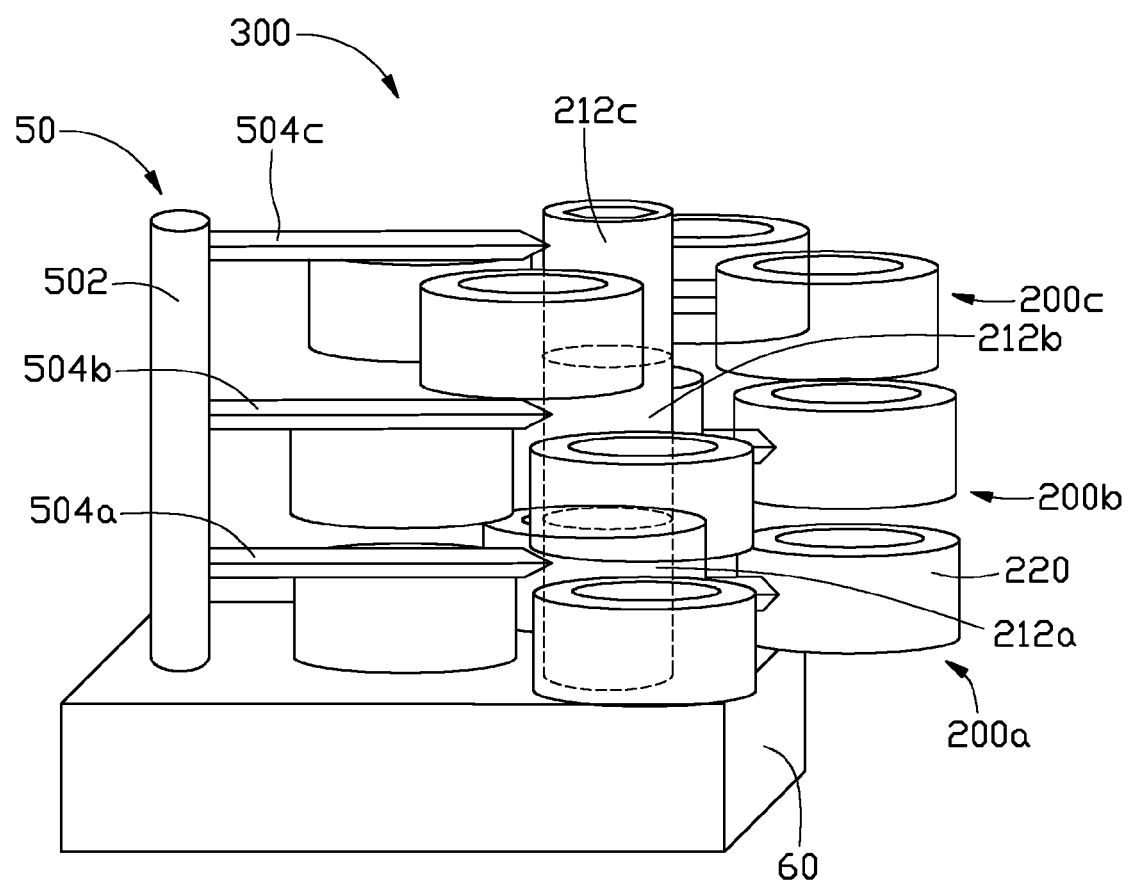
FIG. 4 is an isometric view of an evaporating unit used in a device for film coating in accordance with a second embodiment, the evaporating unit including a base, a first carrier, a second carrier, and a third carrier.
Figure 5:
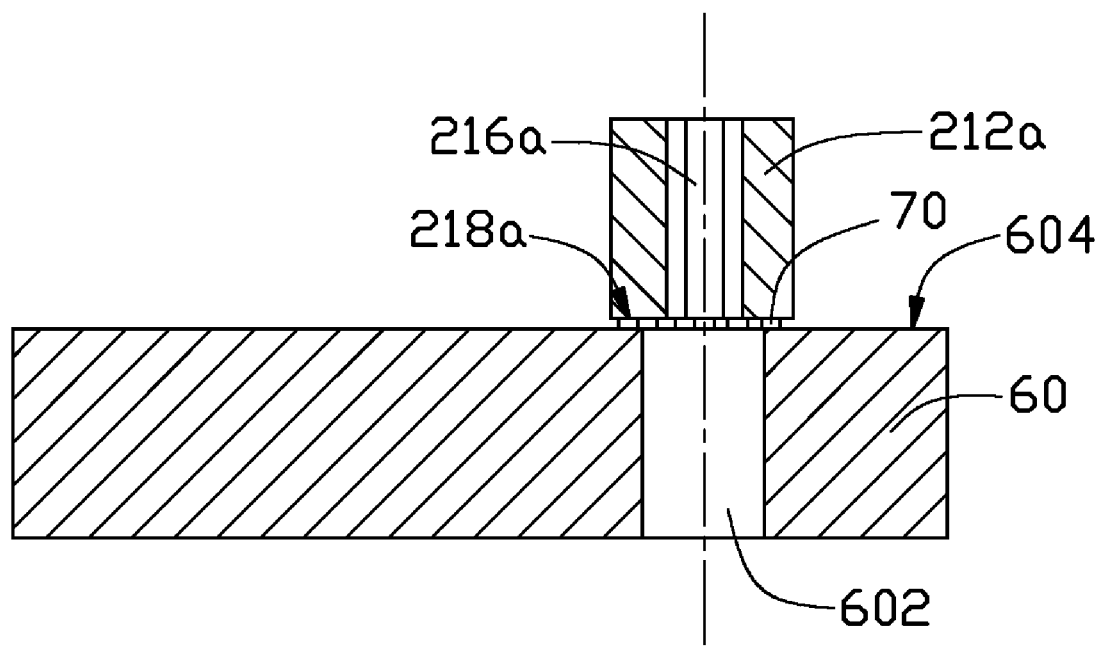
FIG. 5 is a schematic view showing a mount between a main body of the first carrier and the base.
Figure 6:
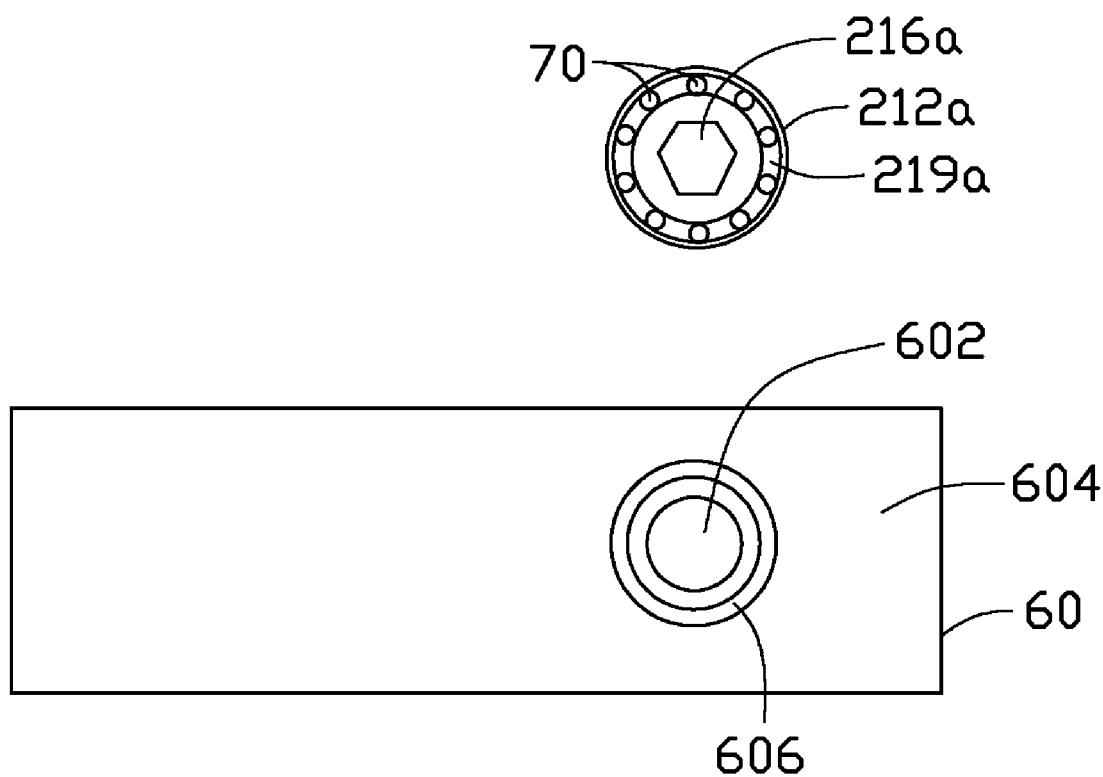
FIG. 6 is a plan view showing mounting surfaces of the main body of the first carrier and the base of FIG. 5.
Figure 7:
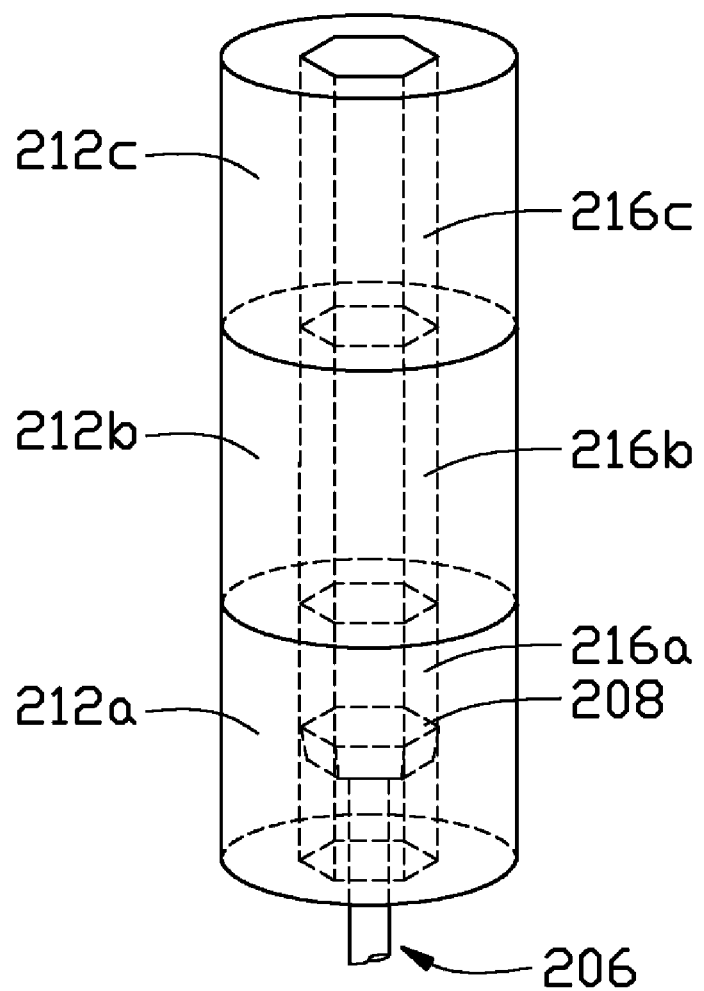
FIG. 7 is a schematic view showing the rotatable shaft is engaged in the main body of the first carrier.
Figure 8:
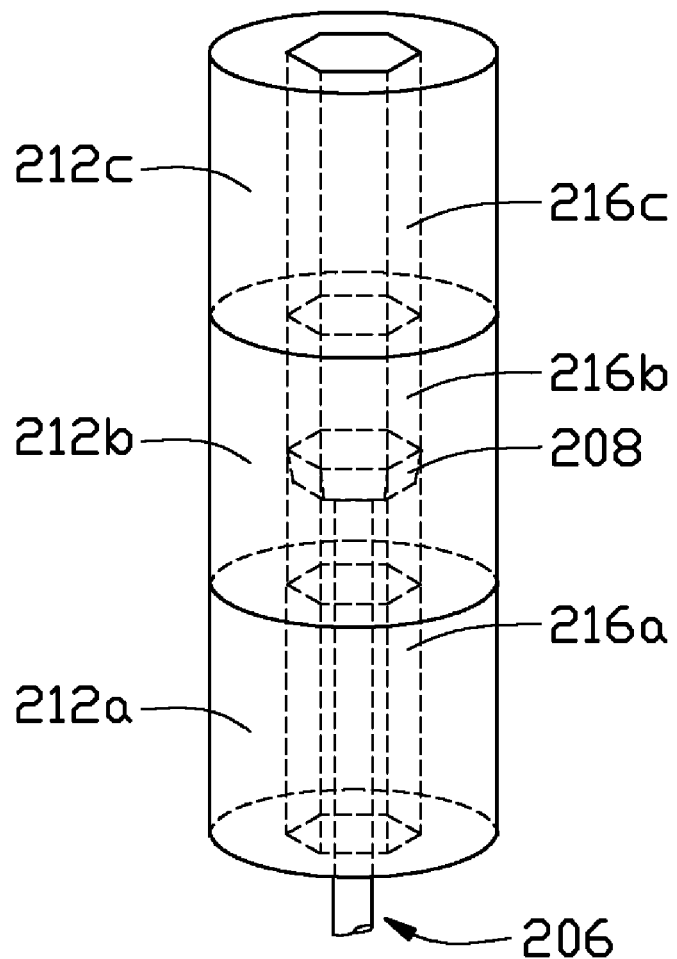
FIG. 8 is a schematic view showing the rotatable shaft is engaged in the main body of the second carrier.
Figure 9:
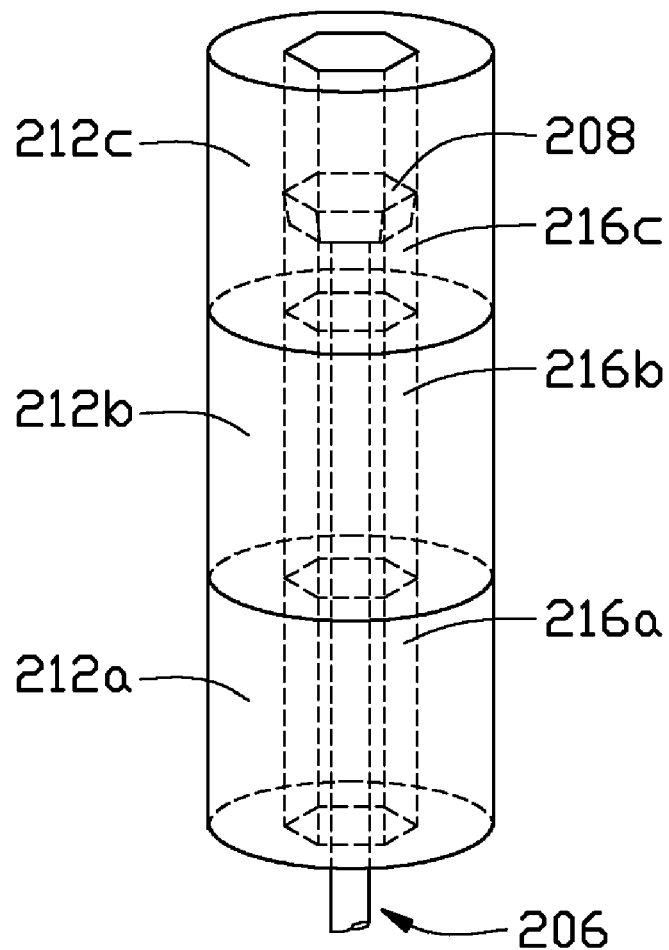
FIG. 9 is a schematic view showing the rotatable shaft is engaged in the main body of the third carrier.

Referring to FIG. 3, a cover 40 is provided. The cover 40 includes a top surface 402, a peripheral side surface 404, and an inner space (not labeled) cooperatively defined by the top surface 402 and the peripheral side surface 404. The top surface 402 defines an evaporating region 405 facing to the substrate to be coated. The evaporating region 405 has a plurality of through holes 406 defined therein. The peripheral side surface 404 has an opening 408 defined therein. The through holes 406 and the opening 408 communicate the inner space of the cover 40. The inner space of the cover 40 can rotatably receive the supporter 210 and the crucibles 220 therein. The electron beam 252 is capable of passing through the opening 408 to reach one of the crucibles 220. During a period of time, only the crucible 220, which is intended to evaporate and deposit the film material therein onto the substrate, faces to the evaporating region 405.

Referring to FIGS. 4 to 9, an exemplary device 300 for film coating in accordance with a second embodiment, is provided. The device 200 includes a positioning member 50, a first carrier 200a, a second carrier 200b, a third carrier 200c, and a driving member 202 (see FIGS. 7 to 9, only the rotatable shaft 206 is shown).

The first, second and third carriers 200a, 200b, 200c have magnetic main bodies 212a, 212b, 212c, respectively. The positioning member 50 includes a base 60, a post 502, a first electromagnet 504a, a second electromagnet 504b and a third electromagnet 504c. The post 502 is attached on the base 60.

The first, second and third electromagnets 504a, 504b, 504c are attached on the post 502 and equally spaced apart from each other. The first, second and third electromagnets 504a, 504b, 504c are parallel to each other, with ends thereof adjacent to the respective main bodies 212a, 212b, 212c of the first, second and third carrier 200a, 200b, 200c. The main body 212a of the first carrier 200a is rotatably mounted on the base 60, and the crucibles 220 of the first carrier 200a are rotatable between the first electromagnet 504a and the base 60. The second carrier 200b is disposed upon the first carrier 200a and the third carrier 200c is disposed upon the second carrier 200b, with the main bodies 212a, 212b, 212c stacking on one another. The crucibles 220 of the second and third carrier 200b and 200c are rotatably between the first, second and third electromagnets 504a, 504b, 504c.

The base 60 has a through hole 602 defined therein, and a surface 604 facing to the main body 212a of the first carrier 200a. A first annular recess 606 is defined in the surface 604, around the through hole 602. Polygonal-shaped through holes 216a, 216b, 216c are defined in the main bodies 212a, 212b, 212c, respectively. The through holes 216a, 216b, 216c communicate with each other. A second annular recess 219a is defined in the end surface of the main body 212a, around the through hole 216a and facing to the base 60. A plurality of ball bearings 70 are filled in the second annular recess 219a, thus the main body 212a of the first carrier 200a is rotatably mounted on the base 60.

The rotatable shaft 206 extends through the through hole 602 of the base 60, and the polygonal-shaped end 208 of the rotatable shaft 206 is selectively engaged in one of the through holes 216a, 216b, 216c. When the polygonal-shaped end 208 is engaged in one of the though holes 216a, 216b, 216c, an electrical current is applied to the corresponding other two of the first, second and third electromagnets 504a, 504b, 504c, thus the corresponding one of the main bodies 212a, 212b, 212c is rotated while the corresponding other two of the main bodies 212a, 212b, 212c can remain in position by attraction of magnetic fields generated by the corresponding other two of the first, second and third electromagnets 504a, 504b, 504c. In this way, it is capable of rotating the corresponding crucibles 220 and positioning one of the corresponding crucibles 220 to face toward the substrate to be coated at a period of time without being blocked by the other crucibles 220. The first carrier 200a, second carrier 200b, and third carrier 200c can work in turn.

It is understood that the above-described embodiments are intended to illustrate rather than limit the invention. Variations may be made to the embodiments without departing from the spirit of the invention. Accordingly, it is appropriate that the appended claims be construed broadly and in a manner consistent with the scope of the invention.

What is claimed is:

1. A device for film coating, comprising:
an evaporating unit, wherein the evaporating unit comprises:
 a driving member having a rotatable shaft;
 a positioning member comprising a first electromagnet and a second electromagnet; and
 a first carrier and a second carrier each comprising a magnetic main body, a plurality of branches extending from the main body and a plurality of crucibles each supported by a respective one of the branches, the main bodies each having a through hole defined therein, the second carrier being disposed upon the first carrier with the through holes communicating with each other, and the rotatable shaft being moveable relative to the first and second carriers and being selectively engaged in one of the through holes and thereby rotating the corresponding main body while the other main body remains in position due to magnetic attraction between the other main body and the corresponding one of the first and second electromagnets.

2. The device as described in claim 1, wherein each of the branches has a first end and an opposite second end, the first ends are arranged in an imaginary circle on the respective main bodies, and the crucibles are attached to the second ends.

3. The device as described in claim 1, wherein the rotatable shaft has a cylindrical body and a polygonal-shaped end, the polygonal-shaped end is larger than the cylindrical body, each of the through holes is polygonal-shaped, and the polygonal-shaped end is engaged in one of the through holes.

4. The device as described in claim 1, wherein the evaporating unit further comprises a cover, the cover having a top surface and a peripheral side surface, the top surface and the peripheral side surface cooperatively defining an inner space for receiving the positioning member and the first and second carriers therein, the top surface defining an evaporating region, a plurality of holes being formed in the evaporating region and communicating the inner space and the process chamber, and each of the crucibles being able to face toward the evaporating region by rotation of the corresponding main body.

5. The device as described in claim 4, wherein the peripheral side surface defines an opening communicating the inner space and the process chamber, the opening configured for allowing electron beams to pass therethrough.

6. The device as described in claim 5, wherein the top surface further defines a blocking region surrounding the evaporating region; and the evaporating region is located separately from a center point of the top surface, near the opening.

7. The device as described in claim 1, wherein the positioning member further comprises a base and a post attached on the base, the first and second electromagnets being attached on the post and spaced apart from each other.

8. The device as described in claim 7, wherein the first and second electromagnets are parallel to each other with ends thereof adjacent to the respective main bodies of the first and second carriers, and the crucibles of the second carrier are freely moveable between the first and second electromagnets.

9. The device as described in claim 7, wherein the main body of the first carrier is rotatably mounted on the base, the crucibles of the first carrier are freely moveable between the first electromagnet and the base, the base has a through hole defined therein, and the rotatable shaft extends through the through hole of the base and is engaged in one of the through holes of the first and second carriers.

10. The device as described in claim 9, wherein the base further has a first recess defined therein, the main body of the first carrier has a second recess defined therein, a plurality of ball bearings are filled in the first recess or the second recess, and thereby the main body of the first carrier is rotatably mounted on the base.

* * * * *

UNITED STATES PATENT AND TRADEMARK OFFICE
CERTIFICATE OF CORRECTION

| | | |
|---|---|---|
| PATENT NO. | : 8,273,180 B2 | Page 1 of 1 |
| APPLICATION NO. | : 12/431778 | |
| DATED | : September 25, 2012 | |
| INVENTOR(S) | : Chung-Pei Wang | |

It is certified that error appears in the above-identified patent and that said Letters Patent is hereby corrected as shown below:

On the title page, please insert Item (30) regarding "Foreign Application Priority Data" with the following:

-- (30)    Foreign Application Priority Data

Jun. 30, 2008   (CN) ......................200810302486.9 --

Signed and Sealed this
Twenty-ninth Day of October, 2013

Teresa Stanek Rea
*Deputy Director of the United States Patent and Trademark Office*